United States Patent
Tsuji

(10) Patent No.: US 10,697,872 B2
(45) Date of Patent: Jun. 30, 2020

(54) MEASUREMENT DEVICE AND MATERIAL TESTER

(71) Applicant: Shimadzu Corporation, Kyoto (JP)

(72) Inventor: Hiroshi Tsuji, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 84 days.

(21) Appl. No.: 16/061,837

(22) PCT Filed: Feb. 24, 2016

(86) PCT No.: PCT/JP2016/055472
§ 371 (c)(1),
(2) Date: Jun. 13, 2018

(87) PCT Pub. No.: WO2017/145295
PCT Pub. Date: Aug. 31, 2017

(65) Prior Publication Data
US 2018/0372602 A1    Dec. 27, 2018

(51) Int. Cl.
*G01N 3/00* (2006.01)
*G01N 3/08* (2006.01)
(Continued)

(52) U.S. Cl.
CPC .............. *G01N 3/08* (2013.01); *G01N 3/06* (2013.01); *G01N 3/066* (2013.01); *G01N 3/62* (2013.01);
(Continued)

(58) Field of Classification Search
CPC ............ G01N 3/08; G01N 3/06; G01N 3/066; G01N 3/62; H03F 3/45; H03F 2200/261; G01B 7/16
(Continued)

(56) References Cited

U.S. PATENT DOCUMENTS

| 6,205,863 B1* | 3/2001 | Ishii | G01N 3/10 |
| | | | 73/805 |
| 2015/0160108 A1* | 6/2015 | Kimura | G01F 1/34 |
| | | | 73/37 |
| 2018/0284176 A1* | 10/2018 | Xia | G01R 31/003 |
| 2019/0101481 A1* | 4/2019 | Dingmann | G01N 3/08 |
| 2019/0243338 A1* | 8/2019 | Golway | G05B 19/4099 |

FOREIGN PATENT DOCUMENTS

| GB | 2 274 918 A | 8/1994 |
| JP | 33336/1991 U | 4/1991 |

(Continued)

OTHER PUBLICATIONS

Search Report dated Aug. 1, 2019 in corresponding European Application No. 16891452.1; 8 pages.
(Continued)

*Primary Examiner* — Max H Noori
(74) *Attorney, Agent, or Firm* — Maier & Maier, PLLC

(57) ABSTRACT

Once a sensor amplifier side connector of a cable unit for interconnecting a detector and a sensor amplifier is connected to the sensor amplifier, a gain resistor on the cable unit side and an instrumentation amplifier of the sensor amplifier are interconnected and the gain of the instrumentation amplifier is determined. As a result, the gain of the instrumentation amplifier is determined such that the magnitude of a signal that the sensor amplifier receives from the detector becomes a magnitude optimal for an analog circuit in the sensor amplifier.

6 Claims, 6 Drawing Sheets

(51) Int. Cl.
*G01N 3/06* (2006.01)
*G01N 3/62* (2006.01)
*H03F 3/45* (2006.01)
*G01B 7/16* (2006.01)

(52) U.S. Cl.
CPC ................. *H03F 3/45* (2013.01); *G01B 7/16* (2013.01); *H03F 2200/261* (2013.01)

(58) Field of Classification Search
USPC .......................................................... 73/788
See application file for complete search history.

(56) References Cited

FOREIGN PATENT DOCUMENTS

| | | |
|---|---|---|
| JP | 2007-78560 A | 3/2007 |
| JP | 2007-218809 A | 8/2007 |
| JP | 2009-250678 A | 10/2009 |
| JP | 2011-169774 A | 9/2011 |
| JP | 4957645 B2 * | 6/2012 |
| JP | 4957645 B2 | 6/2012 |

OTHER PUBLICATIONS

International Search Report and Written Opinion dated May 17, 2016 and Response to the Written Opinion of corresponding International application No. PCIMP2016/055472; 4 pgs.

\* cited by examiner

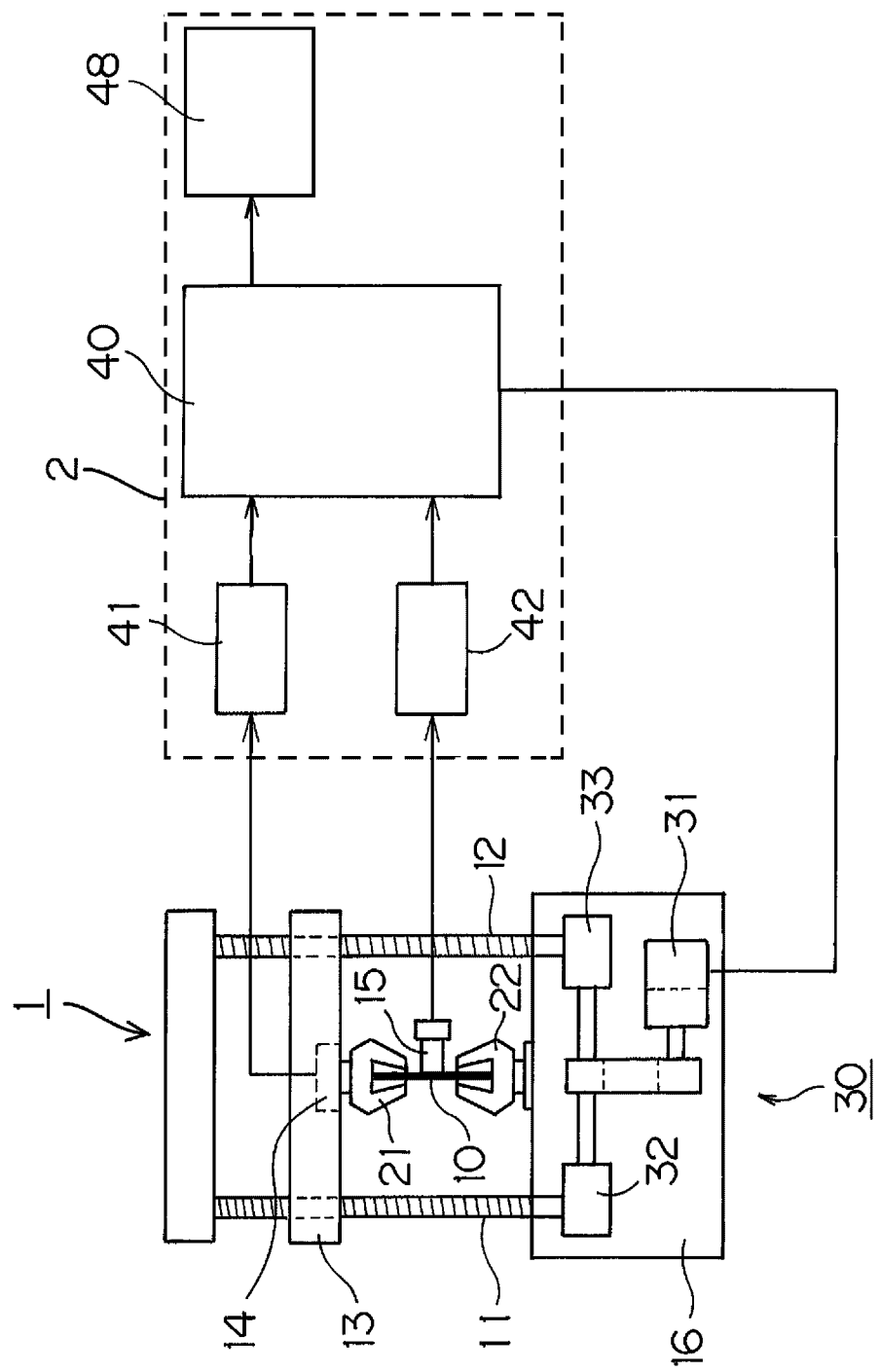
[FIG. 1]

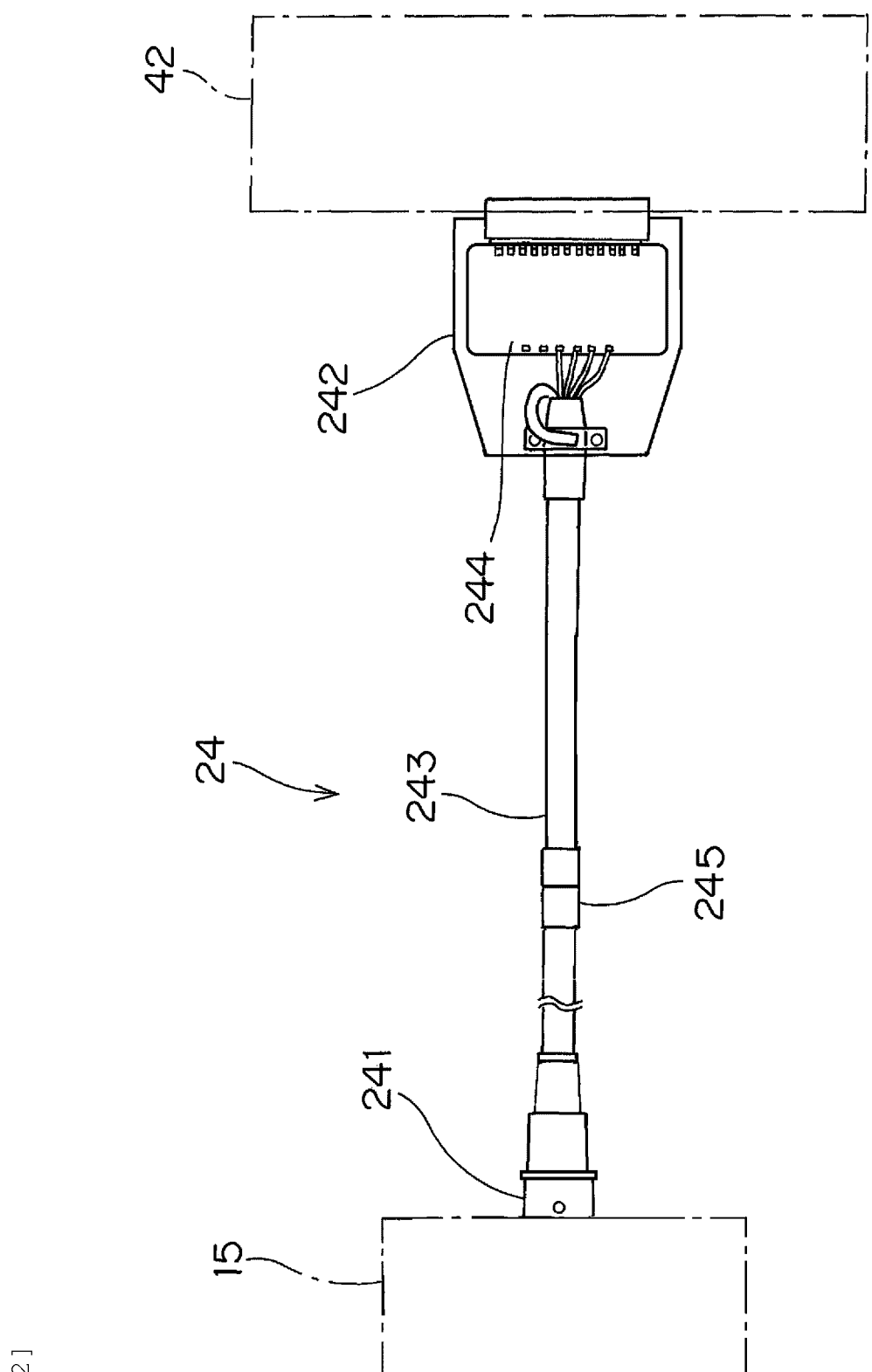

[FIG. 3]
(a)
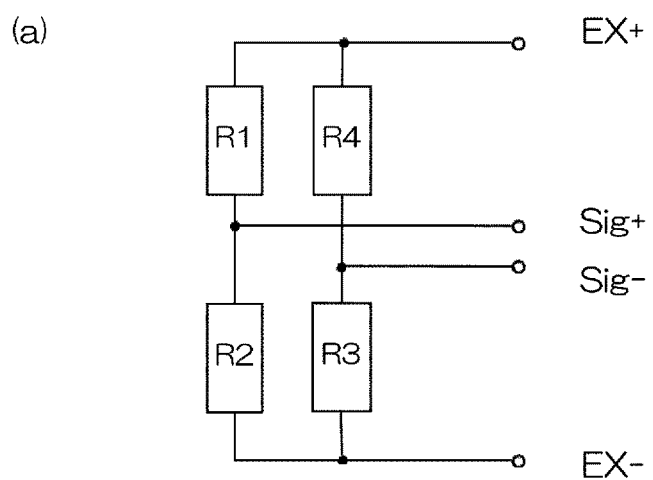
(b)
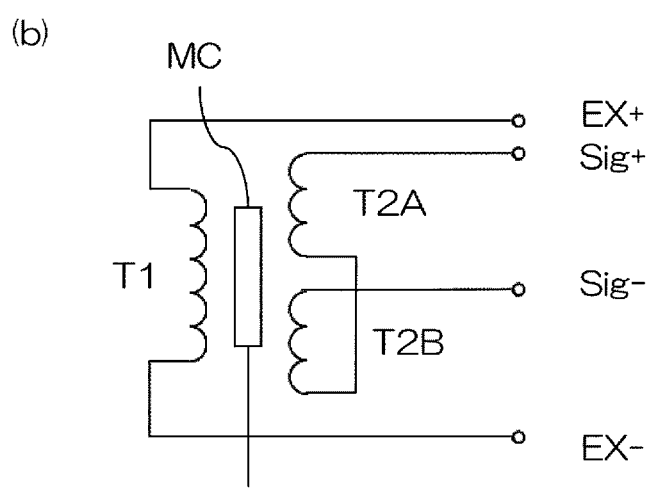
(c)
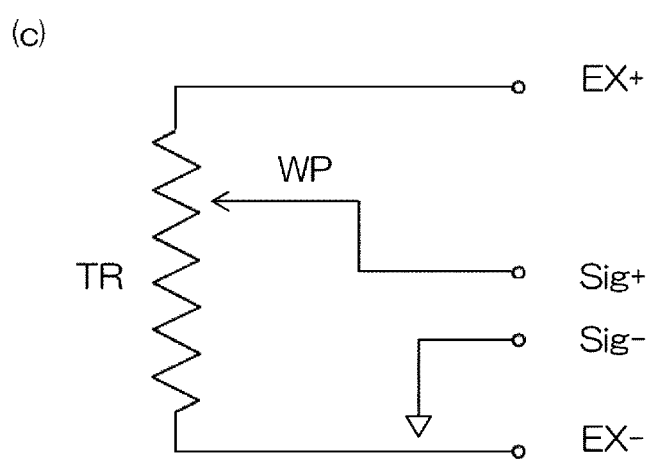

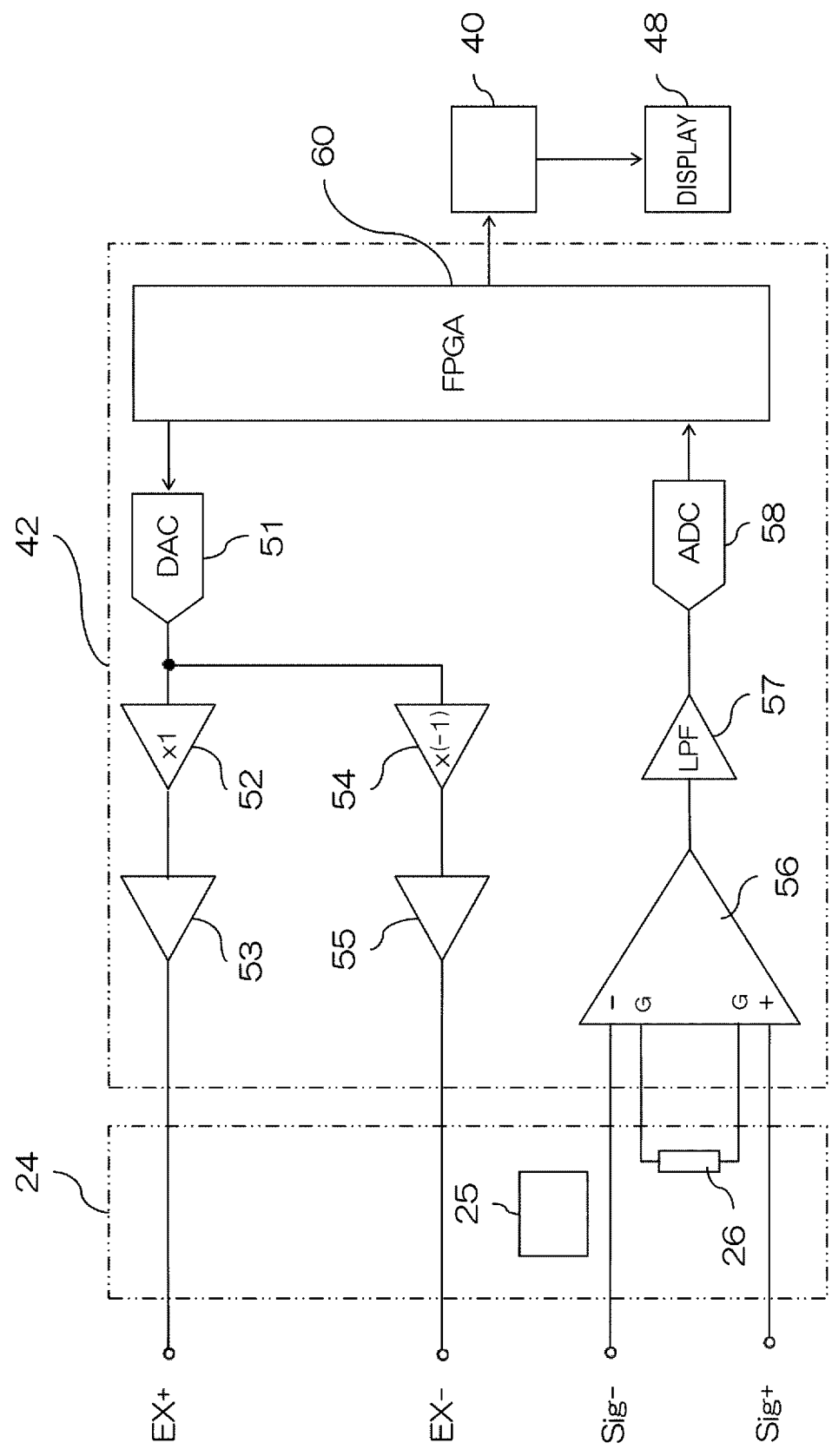
[FIG. 4]

[FIG. 5]
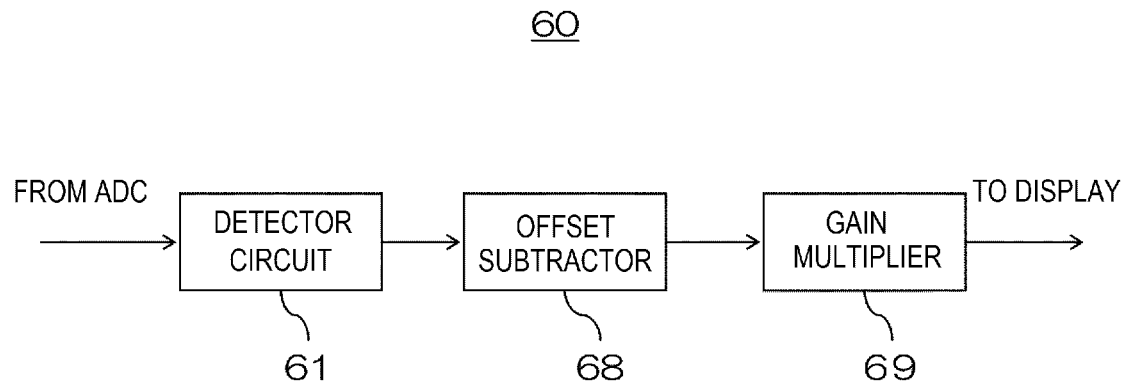

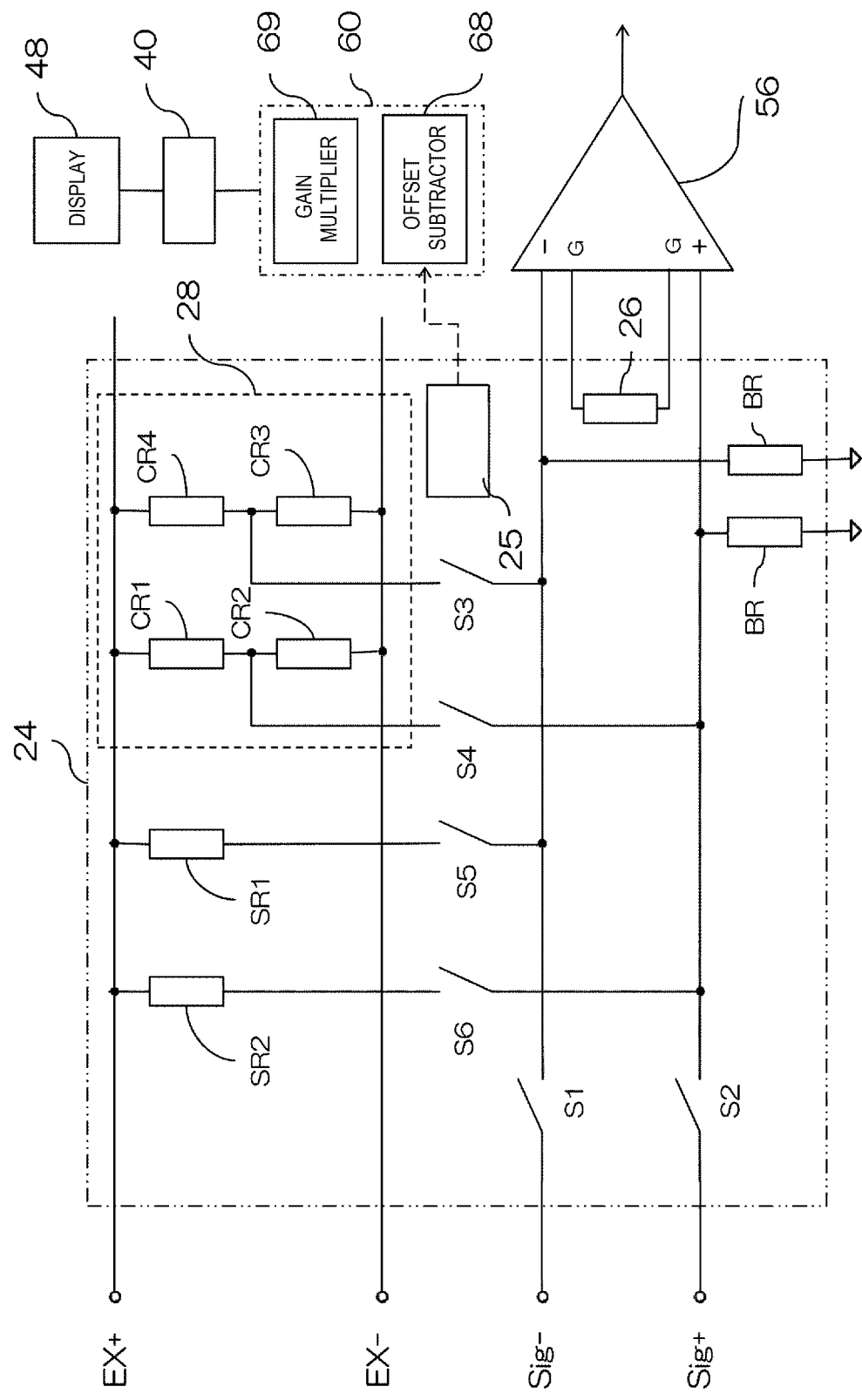
[FIG. 6]

MEASUREMENT DEVICE AND MATERIAL TESTER

FIELD

The present invention relates to a measuring device and a material testing machine provided with a detector converting a physical quantity into an electric signal.

BACKGROUND

Arranged in a material testing machine performing material testing are a load mechanism giving a test load to a test piece and a plurality of detectors converting a physical quantity into an electric signal, examples of the detectors including a test force detector measuring a test force given to the test piece by the load mechanism and a displacement meter detecting displacement generated in the test piece. A physical quantity measuring system for material testing is configured by the detectors being connected to a testing machine controller controlling the entire material testing machine via an amplifier (see Patent Document 1).

In the related art, sensor amplifiers should be individually prepared, in view of the difference between the physical quantity measurement methods of the detectors, on a control device side for each detector to be connected to the control device of the testing machine. In this regard, an amplifier device for a displacement meter to which both a strain gauge type displacement meter and a differential transformer type displacement meter can be connected has been proposed in Patent Document 2 as a displacement detector detecting displacement generated in a test piece.

This type of detector is appropriately used through replacement with respect to a material testing machine main body depending on the types of material testing, and thus a measuring circuit constituting a physical quantity measuring system should be calibrated when the detector is installed in the testing machine main body or from time to time as necessary. In the case of load cells, calibration target value creation and so on are performed, by a load cell supplier or a supplier of apparatuses including load cells, by methods such as a method for inputting a rated capacity equivalent to a load cell and a method for actually giving a known load to a load cell. A load cell user performs work based on calibration information provided by the supplier in order to adjust the gain of a load cell-connected control device side amplifier and confirm the accuracy of test force display at a time when the known load is given.

The electrical measuring circuit calibration required for the user side operation is cumbersome for some users. Proposed in this regard is a control device in which a shunt resistance and a reference bridge circuit for amplifier calibration are provided at a part where a strain gauge type detector is connected so that calibration of an amplifier receiving input from the strain gauge type detector is automated (see Patent Document 3). Also proposed is a material testing machine with which amplifier gain adjustment can be automatically performed by a cable unit being provided with calibration impedance in a case where a differential transformer or a capacitive sensor is used for test piece displacement measurement (see Patent Document 4).

CITATION LIST

Patent Document

Patent Document 1: JP-A-2007-218809
Patent Document 2: JP-A-2011-169774
Patent Document 3: JP-A-2007-78560
Patent Document 4: JP-A-2009-250678

SUMMARY OF THE DISCLOSURE

Sensitivity, which is an output-to-input ratio, varies with displacement meter structures and measurement methods. Patent Document 2 adopts a method for switching the gain of an instrumentation amplifier with respect to a significant sensitivity difference (such as 100 times or more) between displacement meters using different measurement methods. However, gain adjustment is performed with a digital circuit following analog-to-digital conversion with respect to a relatively small sensitivity difference (such as approximately 10 times) between displacement meters using the same measurement method. Accordingly, an AD converter and an analog circuit in an earlier stage than the AD converter are designed not to be saturated despite connection of a displacement meter with the highest assumed sensitivity and, when a low-sensitivity displacement meter is connected, the full scale of the AD converter cannot be sufficiently used.

In addition, in a strain gauge type displacement meter and a load cell that use the same measurement method despite different physical quantities to be measured, the load cell requires high resolution, and thus resolution is insufficient even when the load cell is connected to an amplifier device for a displacement meter as in Patent Document 2. Accordingly, the amplifier device for a displacement meter cannot be used for the load cell. Furthermore, the amplifier device for a displacement meter disclosed in Patent Document 2, which responds to strain gauge and differential transformer type displacement meters, is too sensitive and cannot be used as it is with regard to a potentiometer type displacement meter.

Regarding electrical measuring circuit calibration, in Patent Document 3, a cable for connection between a strain gauge type displacement meter and an amplifier is provided with a circuit for amplifier calibration. No electrical measuring circuit calibration, however, can be performed even when the differential transformer type displacement meter is connected to the amplifier by means of the cable. Although Patent Document 4 has proposed a circuit that is capable of performing electrical calibration in a case where a differential transformer type displacement meter is connected, this technique uses amplifier side impedance as well during calibration, and thus has problems such as the necessity of a circuit therefor in an earlier stage than an instrumentation amplifier, the necessity of a change in cable side impedance reflecting the type and full scale of the differential transformer type displacement meter, and the necessity of the same differential transformer iron core position during calibration.

The invention has been made to solve the above problems, and an object thereof is to provide a measuring device and a material testing machine with which an amplifier can be used at an optimal gain even when any one of detectors using different measurement methods is connected.

Another object of the invention is to provide a measuring device and a material testing machine with which electrical measuring circuit calibration can be automatically performed even in a case where detectors have different types and full scales.

Solution to Problem

A measuring device includes a detector converting a change in physical quantity generated in a measurement object into an electric signal and outputting the electric signal, a sensor amplifier to which the output signal of the detector is input, and a cable unit connecting the detector and the sensor amplifier to each other, in which the cable unit includes a nonvolatile memory storing information on the detector and a resistor determining a gain of the instrumentation amplifier to a gain depending on the information on the detector.

The cable unit includes an electrical calibration circuit having a calibration bridge and a calibration resistance, a switch switching a state of the signal input from the detector to the instrumentation amplifier, and a switch switching a state of connection between the electrical calibration circuit and the instrumentation amplifier.

A material testing machine performs material testing, is provided with a load mechanism giving a test force to a test piece, and is provided with the measuring device.

The measuring device is a measuring device including a load cell detecting the test force given to the test piece or a measuring device including a displacement meter detecting displacement generated in the test piece.

Advantageous Effects of the Invention

The nonvolatile memory storing the information on the connected detector and the resistor determining the gain of the instrumentation amplifier are placed in the cable unit and the resistor in the cable unit determines the gain of the instrumentation amplifier such that the magnitude of the signal that the sensor amplifier receives from the detector becomes a magnitude optimal for an analog circuit in the sensor amplifier. Accordingly, the amplifier can be used at an optimal gain for every detector electrically connectable to the sensor amplifier.

The electrical calibration circuit is provided in the cable unit, and thus so-called shunt calibration can be performed for any connected detector. In other words, with the electrical calibration circuit in the cable unit, electrical calibration can be performed even with respect to detectors that could not be electrically calibrated in the past. Furthermore, the input from the detector side can be disconnected by the switch, and thus a stationary state on the detector side does not have to be confirmed during electrical calibration unlike in the past. Accordingly, electrical calibration can be performed regardless of the state on the detector side. Therefore, the gain on the sensor amplifier side can be accurately adjusted.

The measuring device with which the amplifier can be used at an optimal gain is provided, and thus the accuracy of a measured material testing value can be improved along with resolution.

The amplifier can be used at an optimal amplifier gain at which the capabilities of the load cell and the displacement meter can be appropriately demonstrated, and thus the accuracy of test force and elongation values measured during material testing can be improved.

BRIEF DESCRIPTION OF THE DRAWINGS

FIG. 1 is a schematic diagram of a material testing machine.
FIG. 2 is a schematic diagram of a cable unit 24.
FIG. 3 is a schematic diagram describing the structure of each detector.
FIG. 3a is a schematic diagram describing the structure of each detector.
FIG. 3b is a schematic diagram describing the structure of each detector.
FIG. 3c is a schematic diagram describing the structure of each detector.
FIG. 4 is a configuration schematic diagram illustrating the configuration of a measuring circuit.
FIG. 5 is a block diagram describing the functional configuration of a FPGA 60.
FIG. 6 is a configuration schematic diagram illustrating the circuit configuration of the cable unit 24 for performing electrical calibration.

DETAILED DESCRIPTION

Hereinafter, an embodiment of the invention will be described with reference to accompanying drawings. FIG. 1 is a schematic diagram of a material testing machine.

A testing machine main body 1 and a control device 2 constitute this material testing machine. The testing machine main body 1 is provided with a table 16, a pair of screw rods 11 and 12 rotatably standing on the table 16 while facing a vertical direction, a crosshead 13 movable along the screw rods 11 and 12, a load mechanism 30 for giving a load to a test piece 10 as a measurement object by moving the crosshead 13, and a load cell 14 and a displacement meter 15 as detectors converting a change in physical quantity in the test piece 10 into an electric signal.

The crosshead 13 is connected to the pair of screw rods 11 and 12 via nuts (ball nuts, not illustrated). Worm reducers 32 and 33 of the load mechanism 30 are connected to the lower end portions of the screw rods 11 and 12, respectively. The worm reducers 32 and 33 are connected to a servomotor 31, which is a driving source for the load mechanism 30, and are configured such that rotation of the servomotor 31 is transmitted to the pair of screw rods 11 and 12 via the worm reducers 32 and 33. As a result of rotation of the servomotor 31, the pair of screw rods 11 and 12 synchronously rotate, and then the crosshead 13 moves upward or downward along the screw rods 11 and 12.

An upper gripper 21 for gripping the upper end portion of the test piece 10 is attached to the crosshead 13. A lower gripper 22 for gripping the lower end portion of the test piece 10 is attached to the table 16. In a case where a tensile test is performed, the test piece 10 is loaded with a test force (tensile test force) by the crosshead 13 being raised in a state where both end portions of the test piece 10 are gripped by the upper gripper 21 and the lower gripper 22.

A computer, a sequencer, and peripheral equipment thereof constitute the control device 2, and the control device 2 is provided with a control panel 40 that has a CPU executing a logical operation, a ROM storing an operation program required for apparatus control, a RAM temporarily storing data and so on during control, and the like and controls the entire apparatus. In addition, the control device 2 is provided with a sensor amplifier 41 for a load cell, a sensor amplifier 42 for the displacement meter 15, and a display 48 for displaying a displacement amount and a test force detected by the load cell 14 and the displacement meter 15.

When the load mechanism 30 is operated, the test force that acts on the test piece 10 with both ends gripped by the upper gripper 21 and the lower gripper 22 is detected by the load cell 14 and an output signal of the load cell 14 is input to the control panel 40 via the sensor amplifier 41. In addition, the displacement amount that is generated in the test piece 10 is measured by the displacement meter 15 and an output signal of the displacement meter 15 is input to the control panel 40 via the sensor amplifier 42.

In the control panel 40, data processing is executed by the CPU with test force data and displacement amount data from the load cell 14 and the displacement meter 15 captured. In addition, in the control panel 40, feedback control of rotational drive of the servomotor 31 is executed by means of operation of a control program stored in the ROM and a digital circuit and fluctuations in the test force and the displacement amount input as digital data.

FIG. 2 is a schematic diagram of a cable unit 24.

The displacement meter 15 and the sensor amplifier 42 are connected to each other by the cable unit 24 illustrated in FIG. 2. The cable unit 24 is provided with a sensor side connector 241, a sensor amplifier side connector 242, and a cable main body 243 connecting the sensor side connector 241 and the sensor amplifier side connector 242 to each other. A substrate 244 is arranged in the sensor amplifier side connector 242, and a gain resistor 26 (described later), a nonvolatile memory 25 (described later), and so on are mounted on the substrate 244. A cable joint 245 is provided on the cable main body 243, and the length of the cable main body 243 can be adjusted by an extension cable being inserted in accordance with the positional relationship between the control device 2 and a detector such as the load cell 14 and the displacement meter 15. Although an example in which the displacement meter 15 and the sensor amplifier 42 are connected to each other is illustrated in FIG. 2, the load cell 14 and the sensor amplifier 41 also can be connected with the same cable unit 24.

The displacement meter 15, the cable unit 24, and the sensor amplifier 42 constitute a displacement measuring system for the test piece 10, and the displacement measuring system functions as a measuring device according to the invention. The displacement meter 15 and the cable unit 24 are removable with respect to the testing machine main body 1. In addition, the load cell 14, the cable unit 24, and the sensor amplifier 41 constitute a system measuring a test force given to the test piece 10, and the test force measuring system functions as a measuring device according to the invention. The load cell 14 and the cable unit 24 are removable with respect to the testing machine main body 1.

FIG. 3 is a schematic diagram describing the structure of each detector. FIG. 4 is a configuration schematic diagram of a measuring circuit. FIG. 5 is a block diagram describing the functional configuration of a field-programmable gate array (FPGA) 60. The measuring circuit illustrated in FIG. 4 is the same for every detector illustrated in FIG. 3 and will be described as the configuration of the measuring circuit of the measuring device.

The material testing machine illustrated in FIG. 1 is provided with the load cell 14 and the displacement meter 15. The load cell 14 is a strain gauge type sensor measuring a test force by using a change in the electric resistance of a strain gauge. As illustrated in FIG. 3(a), the load cell 14 is provided with a bridge circuit in which strain gauges R1 to R4 with the same resistance value are connected.

The displacement meter 15 is divided into a strain gauge type displacement meter, a differential transformer type displacement meter, and a potentiometer type displacement meter depending on measurement methods, and the meters are selected in accordance with testing content. The strain gauge type displacement meter is provided with the bridge circuit that is illustrated in FIG. 3(a) as is the case with the load cell 14. As illustrated in FIG. 3(b), the differential transformer type displacement meter is provided with a primary coil T1, secondary coils T2A and T2B, and an iron core MC moving in conjunction with elongation of the test piece 10. The differential transformer type displacement meter is a detector obtaining voltage output depending on displacement by using the occurrence of a difference depending on the position of the iron core MC between the induced voltages of the secondary coil T2A and the secondary coil T2B generated when the primary coil T1 is excited. As illustrated in FIG. 3(c), the potentiometer type displacement meter is provided with a resistor TR and a wiper WP. The potentiometer type displacement meter is a detector converting a relative displacement amount of the resistor TR and the wiper WP into voltage output. The Sig− of the potentiometer type displacement meter is connected to a signal ground. The input terminals EX+ and EX− and the output terminals Sig+ and Sig− of each detector illustrated in FIG. 3 are respectively connected to corresponding connection terminals of the sensor side connector 241 of the cable unit 24.

The sensor amplifier 42 is provided with a digital circuit based on the FPGA 60 and an analog circuit including an instrumentation amplifier 56, a low pass filter (LPF) 57, an analog-to-digital converter (ADC) 58, a digital-to-analog converter (DAC) 51, operational amplifiers 52 and 54, and power amplifiers 53 and 55. Built as a logic circuit inside the FPGA 60 are a gain multiplier 69, an offset subtractor 68, and a detector circuit 61 storing waveform data sent from the FPGA 60 to the DAC 51 and extracting signal components of a test force value and an elongation value from a signal input from the ADC 58. The offset subtractor 68 subtracts, from digital data that went through the detector circuit 61, an offset value indicating the steady states of the test force value and the elongation value at testing initiation. The gain multiplier 69 is mainly to adjust a gain difference attributable to an individual difference in detectors of the same type and sensitivity. Although a FPGA is used as a device realizing a logic circuit processing a digital signal in this embodiment, another programmable logic device (PLD) capable of rewriting an internal circuit and a microcomputer performing digital signal processing with software may be used instead.

The cable unit 24 is provided with the nonvolatile memory 25 and the gain resistor 26 determining the gain of the instrumentation amplifier 56 of the sensor amplifier 42. Information on the type of each detector and information related thereto (such as model and full scale) are stored in the nonvolatile memory 25.

A waveform signal of a drive voltage input to the input terminals EX+ and EX− of each detector is transmitted from the FPGA 60 to the DAC 51. A waveform generated from the DAC 51 is input to the operational amplifiers 52 and 54, turned into a drive waveform as a plus or minus subject focusing on zero volt, and then amplified by the power amplifiers 53 and 55 and supplied to a detector as an excitation signal. A signal output from the output terminals Sig+ and Sig− of a detector is input to the instrumentation amplifier 56 and a difference is retrieved. Then, the LPF 57 removes a component exceeding the Nyquist frequency of the ADC 58, and then the signal is converted into a digital signal by the ADC 58 and input to the FPGA 60. Subsequently, after signal processing in the FPGA 60, the test force value or the elongation value (displacement amount) of the test piece 10 is displayed on the display 48 via the control panel 40.

Once the sensor amplifier side connector 242 of the cable unit 24 is connected to the sensor amplifier 42, the information stored in the nonvolatile memory 25 of the substrate 244, such as detector model information, is read into the FPGA 60. The cable unit 24 and a detector are used as a pair, and the resistance value of the gain resistor 26 is a value determined in advance depending on detectors to be optimal in magnitude for the analog circuit in the sensor amplifier 42.

Not only a circuit element on the sensor amplifier side but also the gain resistor 26 provided in the cable unit 24 determines (or sets) the gain of the instrumentation amplifier 56 to which the signal output from the output terminals Sig+ and Sig− of each detector is input. In conventional apparatuses, an analog circuit in an earlier stage than the ADC 58 of the sensor amplifier 42 is designed, for example, not to be saturated even when the displacement meter 15 that has the highest sensitivity among the displacement meters 15 of the same measurement method is connected. Accordingly, once the resistance value of the instrumentation amplifier 56 is fixed on the sensor amplifier side, the full scale of the ADC 58 cannot be used, which is a problem, when the displacement meter 15 with low sensitivity is connected. However, by the gain of the instrumentation amplifier 56 being set by the gain resistor 26 provided in the cable unit 24 as in the measuring device according to the invention, the full scale of the ADC 58 can be used to the maximum extent possible regardless of the sensitivity of the displacement meter 15. Therefore, the displacement meters 15 based on different measurement methods as illustrated in FIGS. 3(a) to 3(c) can be connected.

The cable unit 24 described with reference to FIG. 4 is provided with the nonvolatile memory 25 storing information on a detector connected to the sensor amplifier 42 and the gain resistor 26 determining the gain of the instrumentation amplifier 56 of the sensor amplifier 42 in accordance with the type and full scale of the detector. A case where a circuit for electrical measuring circuit calibration is provided will be additionally described below. FIG. 6 is a configuration schematic diagram illustrating the circuit configuration of the cable unit 24 for performing electrical calibration.

The cable unit 24 is provided with an electrical calibration circuit having a calibration bridge 28 of four resistors CR1 to CR4 and shunt resistances SR1 and SR2 as calibration resistors, switches S1 and S2 switching the connection state of signal input from each detector to the instrumentation amplifier 56, and switches S3 to S6 switching the connection state of the electrical calibration circuit and the instrumentation amplifier 56. The switch S3 and the switch S4 selectively connect the calibration bridge 28 to the instrumentation amplifier 56. The switch S5 selectively connects the shunt resistance SR1 in parallel to the calibration bridge 28. The switch S6 selectively connects the shunt resistance SR2 in parallel to the calibration bridge 28. The shunt resistance SR1 is a calibration resistance at a time when the direction of displacement of the test piece 10 is to the compression side, and the shunt resistance SR2 is a calibration resistance at a time when the direction of displacement of the test piece 10 is to the tension side. In addition, a bias resistance BR is placed on the path through which an input signal of the cable unit 24 is output to the instrumentation amplifier 56 and supplies an input bias current to the instrumentation amplifier. Various electrical elements built into the cable unit 24 are mounted on a printed substrate 244 provided in the sensor amplifier side connector 242.

Calibration of a physical quantity measuring circuit including the sensor amplifier of each detector by means of the cable unit 24 will be described below. Physical quantity measuring circuit calibration is divided into actual displacement- and actual test force-based calibration and shunt resistance-based electrical calibration. The actual displacement- and actual test force-based calibration, which is performed by a material testing machine manufacturer or maintenance contractor, is to actually give calibrated actual displacement or the like to a detector before material testing machine shipment and during maintenance based on detector removal from the testing machine main body 1. The electrical calibration, which is performed by a material testing machine user, is to adjust the gain of a sensor amplifier by electrically reproducing virtual physical displacement.

The actual displacement- and actual test force-based calibration will be described first. The cable unit 24 is connected to a detector and an accuracy-guaranteed calibrator (not illustrated) for giving actual displacement or actual test force is attached. At this time, the switches S1 and S2 illustrated in FIG. 6 are left closed and the switches S3 to S6 are left open. Zero load or zero elongation is given to the detector in this state, and the offset value at which the value of the display 48 at this time becomes zero, that is, a value subtracted by the offset subtractor 68 of the FPGA 60 is obtained. Then, the offset value is stored in the nonvolatile memory 25 of the cable unit 24. The offset value indicates the steady states of a test force value and an elongation value at testing initiation. Subsequently, a rated capacity-equivalent (full scale) load is given to the detector by the calibrator, and a value multiplied by the gain multiplier 69 of the FPGA 60 is adjusted such that the display 48 shows a full scale value.

Once the gain adjustment for the gain multiplier 69 is over, the switch S1 and the switch S2 are opened and the switch S3 and the switch S4 are closed. In other words, a state is made where a signal from the detector is disconnected and the calibration bridge 28 is connected. The value subtracted by the offset subtractor 68 of the FPGA 60 is adjusted such that the display 48 shows zero. Then, either the switch S5 or the switch S6 is closed depending on whether the direction of displacement or test force is to either the tension side or the compression side and the calibration bridge 28 is distorted in a pseudo manner, and the value that the display 48 shows at that time is stored in the nonvolatile memory 25 of the cable unit 24. Subsequently, all of the switches S3 to S6 are opened and the switch S1 and the switch S2 are closed. Then, the value held by the offset subtractor 68 at this time to be subtracted from the signal input from the detector circuit 61 is written back to the value previously stored in the nonvolatile memory 25 (offset value). Then, the actual displacement- and actual test force-based calibration terminates.

During the actual displacement- and actual test force-based calibration, the gain of the sensor amplifier is confirmed first by the measuring circuit being calibrated with actual displacement and actual test force. Subsequently, input to the instrumentation amplifier 56 is switched from the detector to the calibration bridge 28 and an electrical calibration target value (value shown by the display 48 when the shunt resistance was given to the calibration bridge 28) is created by the shunt resistance SR1 or the shunt resistance SR2 being used.

The shunt resistance-based electrical calibration will be described below. Firstly, a state is made where the switch S1 and the switch S2 are open, the switch S3 and the switch S4 are closed, and the switch S5 and the switch S6 are open. In other words, a state is made where input from the detector is disconnected and the calibration bridge 28 is connected. In this state, the value subtracted by the offset subtractor 68 is adjusted such that the value of the display 48 shows zero. Either the switch S5 or the switch S6 is closed depending on whether the direction of displacement or test force is to either the tension side or the compression side and a pseudo strain is given to the calibration bridge 28. The value multiplied by the gain multiplier 69 of the FPGA 60 is adjusted such that the value of the display 48 at this time corresponds to the value shown by the display 48 and stored in the nonvolatile memory 25, that is, the value shown by the display 48 when a rated capacity-equivalent load was given during the actual displacement-based calibration.

Once the gain adjustment for the gain multiplier 69 is over, a state is made where the switch S3 to switch S6 are open and the switch S1 and the switch S2 are closed. Then, the value held by the offset subtractor 68 at this time to be subtracted from the signal input from the detector circuit 61 is written back to the value previously stored in the nonvolatile memory (offset value). Then, the shunt resistance-based electrical calibration terminates.

During the execution of the electrical calibration, the gain of the sensor amplifier is adjusted by the calibration bridge 28 and the shunt resistance SR1 or the shunt resistance SR2 being used such that the value shown by the display 48 corresponds to the target value previously stored in the nonvolatile memory 25. Subsequently, physical quantity measurement is performed with the input source of the signal to the instrumentation amplifier 56 switched to the detector.

As described above, according to the invention, an electrical element required for measuring circuit calibration is built into the cable unit 24. Accordingly, especially during the shunt resistance-based electrical calibration performed on a user side, the circuit in the cable unit 24 is not affected at all, even when a user touches the detector during the execution of the calibration, since the switch S1 and the switch S2 are open. Therefore, the electrical calibration can still be executed even in a state where a user touches the detector due to attachment of the test piece 10 or the like. In addition, material testing work efficiency is improved as testing preparation and electrical calibration are performed together. Furthermore, since the electrical element required for measuring circuit calibration is built into the cable unit 24, electrical calibration of a differential transformer type displacement meter, which is not easy with the related art, can be performed with ease.

Conventional electrical calibration is executed by a user performing an execution operation after confirming that the testing machine main body 1 and a detector are in a physically stable state. With the invention, however, electrical calibration can be executed at a preset timing such as 10 minutes after energization and immediately after testing.

Information required for detector identification, such as detector types and specifications, can be stored in the nonvolatile memory 25 of the cable unit 24 and the gain resistor 26 of the cable unit 24 is placed in accordance with the types and full scales of detectors, and thus any of the detectors that are strain gauge type load cells, strain gauge type displacement meters, differential transformer type displacement meters, and potentiometer type displacement meters can be connected to the sensor amplifier by the cable unit 24 being used and the accuracy and resolution on the sensor amplifier side can be improved.

REFERENCE SIGNS LIST

1 Testing machine main body
2 Control device
10 Test piece
11 Screw rod
12 Screw rod
13 Crosshead
14 Load cell
15 Displacement meter
16 Table
21 Upper gripper
22 Lower gripper
24 Cable unit
25 Nonvolatile memory
26 Gain resistor
28 Calibration bridge
30 Load mechanism
31 Servomotor
32 Worm reducer
33 Worm reducer
40 Control panel
41 Sensor amplifier
42 Sensor amplifier
48 Display
51 DAC
52 Operational amplifier
53 Power amplifier
54 Operational amplifier
55 Power amplifier
56 Instrumentation amplifier
57 LPF
58 ADC
60 FPGA
61 Detector circuit
68 Offset subtractor
69 Gain multiplier

The invention claimed is:

1. A measuring device comprising:
   a detector converting a change in physical quantity generated in a measurement object into an electric signal and outputting the electric signal;
   a sensor amplifier to which the output signal of the detector is input; and
   a cable unit connecting the detector and the sensor amplifier to each other,
   wherein the cable unit includes a nonvolatile memory storing information on the detector and a resistor determining a gain of an instrumentation amplifier inside the sensor amplifier to a gain depending on the information on the detector.

2. The measuring device according to claim 1, wherein the cable unit includes:
   an electrical calibration circuit having a calibration bridge and a calibration resistance;
   a switch switching a state of the signal input from the detector to the instrumentation amplifier; and
   a switch switching a state of connection between the electrical calibration circuit and the instrumentation amplifier.

3. A material testing machine performing material testing, comprising a load mechanism giving a test force to a test piece, and the measuring device according to claim 1.

4. The material testing machine according to claim 3, wherein the measuring device is a measuring device including a load cell detecting the test force given to the test piece or a measuring device including a displacement meter detecting displacement generated in the test piece.

5. A material testing machine performing material testing, provided with a load mechanism giving a test force to a test piece, and provided with the measuring device according to claim 2.

6. The material testing machine according to claim 5, wherein the measuring device is a measuring device including a load cell detecting the test force given to the test piece or a measuring device including a displacement meter detecting displacement generated in the test piece.

* * * * *